(12) United States Patent
Lim et al.

(10) Patent No.: US 8,399,182 B2
(45) Date of Patent: Mar. 19, 2013

(54) METHOD OF FABRICATING LIQUID CRYSTAL DISPLAY DEVICE

(75) Inventors: Jae-Hyung Lim, Seoul (KR); Dong-Guk Kim, Goyang-si (KR); Jong-Hwae Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 317 days.

(21) Appl. No.: 12/941,835

(22) Filed: Nov. 8, 2010

(65) Prior Publication Data

US 2011/0143285 A1 Jun. 16, 2011

(30) Foreign Application Priority Data

Dec. 14, 2009 (KR) ........................ 10-2009-0123937

(51) Int. Cl.
  *G03F 7/20* (2006.01)
(52) U.S. Cl. .......................... 430/316; 430/319; 430/321
(58) Field of Classification Search .................. None
  See application file for complete search history.

(56) References Cited

U.S. PATENT DOCUMENTS

| 4,714,668 | A | * | 12/1987 | Uneno et al. | 430/316 |
| 2004/0090575 | A1 | * | 5/2004 | Tang et al. | 349/113 |
| 2007/0279559 | A1 | * | 12/2007 | Mori et al. | 349/114 |

* cited by examiner

*Primary Examiner* — John A. McPherson
(74) *Attorney, Agent, or Firm* — Birch, Stewart, Kolasch & Birch, LLP

(57) ABSTRACT

A method of fabricating a transflective type liquid crystal display device includes: forming gate and data lines with a gate insulating layer therebetween on a substrate and crossing each other to define a pixel region that includes a switching region, a reflective region, and a transmissive region; forming a thin film transistor corresponding to the switching region and connected to the gate and data lines; forming a first passivation layer on the thin film transistor; forming a reflective plate on the first passivation layer in the reflective region; forming a second passivation layer on the reflective plate; forming a pixel electrode on the second passivation layer and connected to a drain electrode of the thin film transistor; forming a third passivation layer on the pixel electrode.

13 Claims, 19 Drawing Sheets

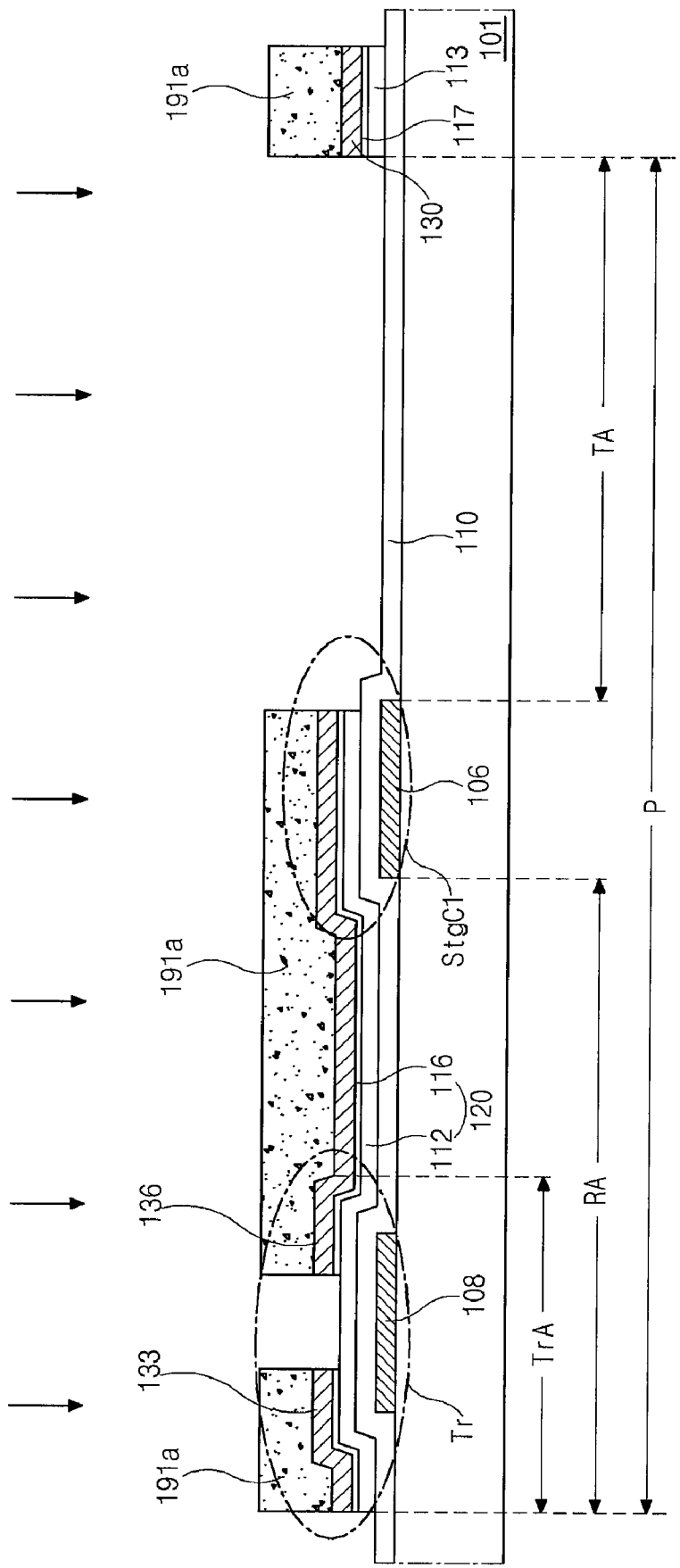

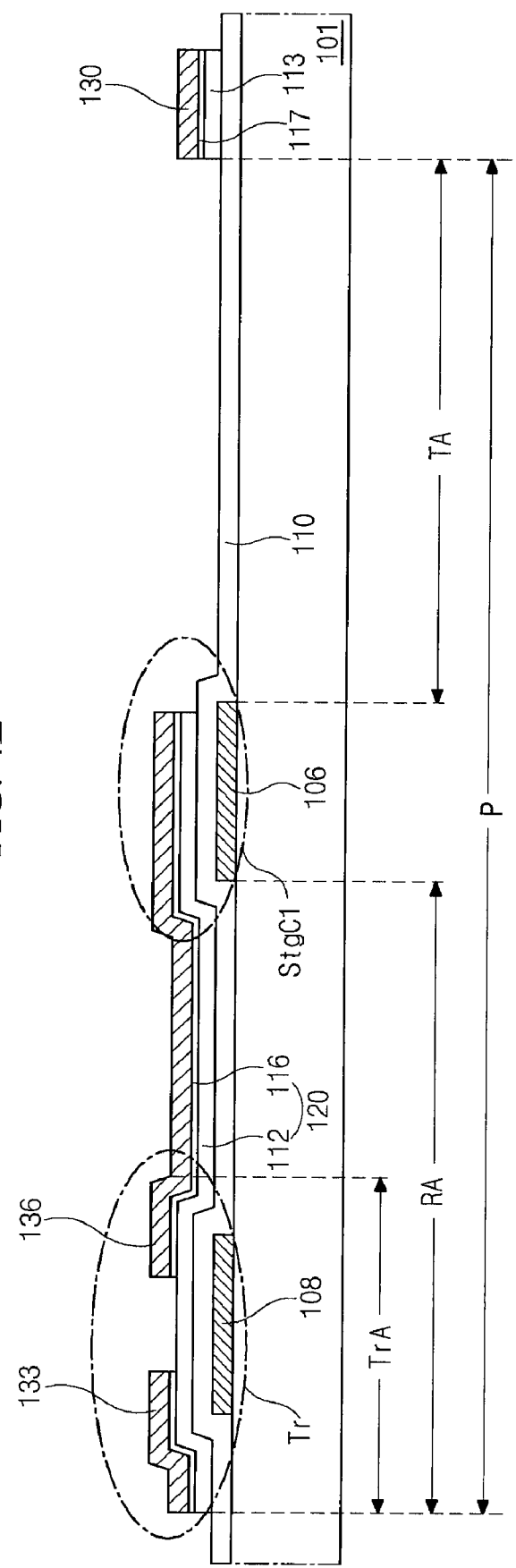

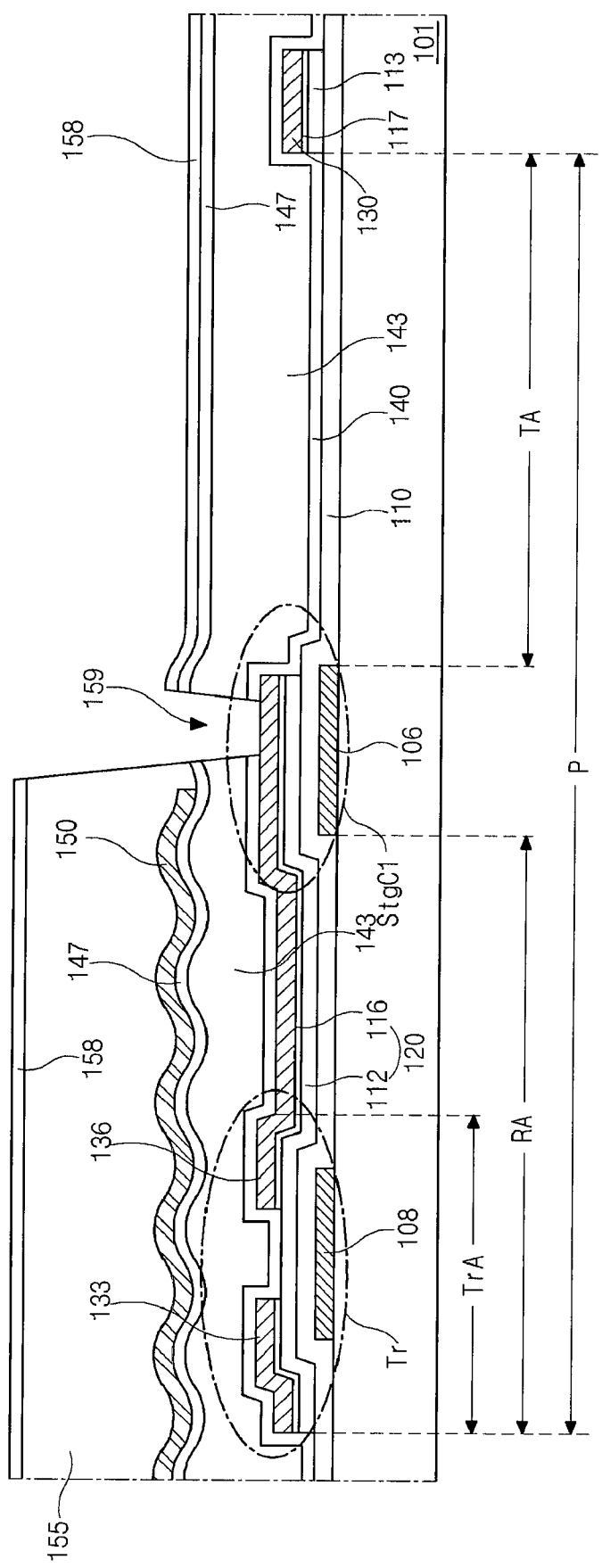

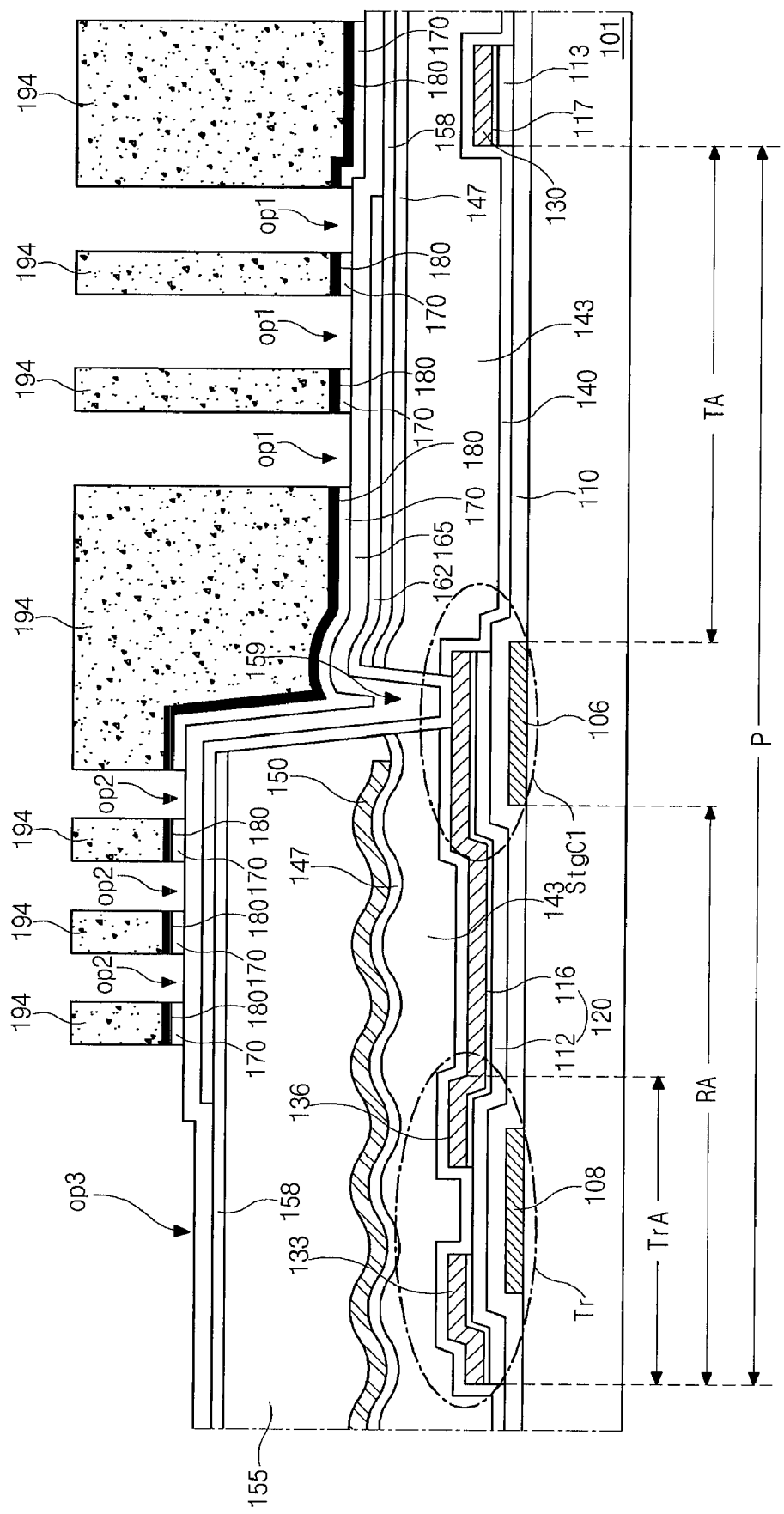

METHOD OF FABRICATING LIQUID CRYSTAL DISPLAY DEVICE

The present invention claims the priority benefit of Korean Patent Application No. 10-2009-0123937, filed in Korea on Dec. 14, 2009, which is hereby incorporated by reference for all purposes as if fully set forth herein.

BACKGROUND OF THE INVENTION

1. Field of the Invention

The present invention relates to a liquid crystal display device, and more particularly, to a method of fabricating a liquid crystal display device.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

The LCD device is categorized into a transmissive type, a reflective type, and a transflective type. The transmissive type LCD device uses a backlight and thus can display images brightly in dark surroundings. However, the transmissive type LCD device consumes much power. The reflective type LCD device uses an external light such as sunlight instead of the backlight and thus can reduce power consumption. However, the reflective type LCD device cannot be used in dark surroundings or where the external light does not exist.

The transflective LCD device selectively operates in a transmissive mode or a reflective mode according to surroundings. Accordingly, the transflective LCI) device has advantage that each of the transmissive and reflective LCD devices has.

As the transflective LCD device, an IPS (in-plane switching) mode transflective type LCD device is used in order to improve viewing angles.

FIG. 1 is a cross-sectional view illustrating a pixel region of an array substrate for an IPS mode transflective LCD type device according to the related art, FIG. 2 is a picture illustrating disconnection defect of a common electrode of the LCD device according to the related art, and FIG. 3 is a cross-sectional view illustrating a process of forming the common electrode of the LCD device according to the related art.

Referring to FIG. 1, a pixel region P includes a reflective region RA and a transmissive region TA.

Although not shown in the drawings, gate and data lines crossing each other are formed on a substrate 2 and define the pixel region P. A common line in parallel with and spaced apart from the gate line is formed on the substrate 2. A thin film transistor is formed in the pixel region P and connected to the gate and data lines.

A reflective plate 50 is formed in the reflective region RA to reflect an external light. The reflective plate 50 is not formed in the transmissive region TA.

A pixel electrode 70 is formed on the reflective plate 50. The pixel electrode 70 is in the pixel region P.

A common electrode 80 is formed on the pixel electrode 70. The common electrode has a plurality of openings op1 and op2 that each have a bar shape. The openings op1 and op2 include first and second openings op1 and op2 that are located in the transmissive and reflective regions TA and RA, respectively. The first and second openings op1 and op2 are different in length direction.

The array substrate of the related art is fabricated through 9 mask processes. The mask process may include a process of depositing a material to be patterned, a process of depositing a photoresist, a light exposure process using a photo mask, a process of developing the light-exposed photoresist, a process of etching the material layer using the photoresist, a process of stripping the photoresist, and the like.

During the mask processes, some defects occur in the array substrate. Particularly, referring to FIG. 2, when forming the common electrode 80 after forming the reflective plate (50 of FIG. 1), frequently occurs a defect that finger portions of the common electrode 80 between the neighboring openings are disconnected.

Referring to FIG. 3, the finger portions of the common electrode (80 of FIG. 1) between the neighboring second openings opt in the reflective region RA are designed to have a width of about 10 μm to about 20 μm. In a light exposure process, light passing through a transmissive portion TA of a photo mask 95 may be reflected by the reflective plate 50 and then incident on a portion of a photoresist layer 91 that corresponds to a blocking portion BA of the photo mask 95 but the light should not be incident on.

After the light exposure process, the photoresist layer 91 is developed to form a photoresist pattern, and in the developing process, the photoresist layer 91 exposed to light is removed. Then, an etching is performed for a layer 79 to form the common electrode 80 using the photoresist pattern. Through the etching process, the common electrode 80 is formed.

However, as described above, the portion of the photoresist layer 91 below the blocking portion BA and in the reflective region RA is unintentionally exposed to light due to the reflection by the reflective plate 50. Accordingly, the portion of the photoresist layer 91 below the blocking portion BA is unintentionally removed in the developing process, and thus a portion of the layer 79, that becomes the finger portion of the common electrode 80, below the unintentionally removed portion of the photoresist layer is removed in the etching process. Therefore, the disconnection of the finger portion is caused.

SUMMARY OF THE INVENTION

Accordingly, the present invention is directed to a method of fabricating a liquid crystal display device which substantially obviates one or more of the problems due to limitations and disadvantages of the related art.

An advantage of the present invention is to provide a method of fabricating a liquid crystal display device that can prevent disconnection of a common electrode.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, a method of fabricating a transflective type liquid crystal display device includes: forming gate and data lines with a gate insulating layer therebetween on a substrate and crossing each other to define a pixel region that includes a switching region, a reflective region, and a transmissive region; forming a thin film transistor corresponding to the switching region and connected to the gate and data lines; forming a first passivation layer on the thin film transistor; forming a reflective plate on the first passivation layer in the reflective region; forming a second passivation layer on the reflective plate; forming a pixel electrode on the second passivation layer and connected to a drain electrode of the thin film transistor; forming a third passivation layer on the pixel electrode; forming a transparent conductive material layer on the third passivation layer; forming a reflection prevention layer on the transparent conductive material layer; and patterning the reflection prevention layer and the transparent conductive material layer to form a common electrode that includes a plurality of openings and is made of the transparent conductive material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
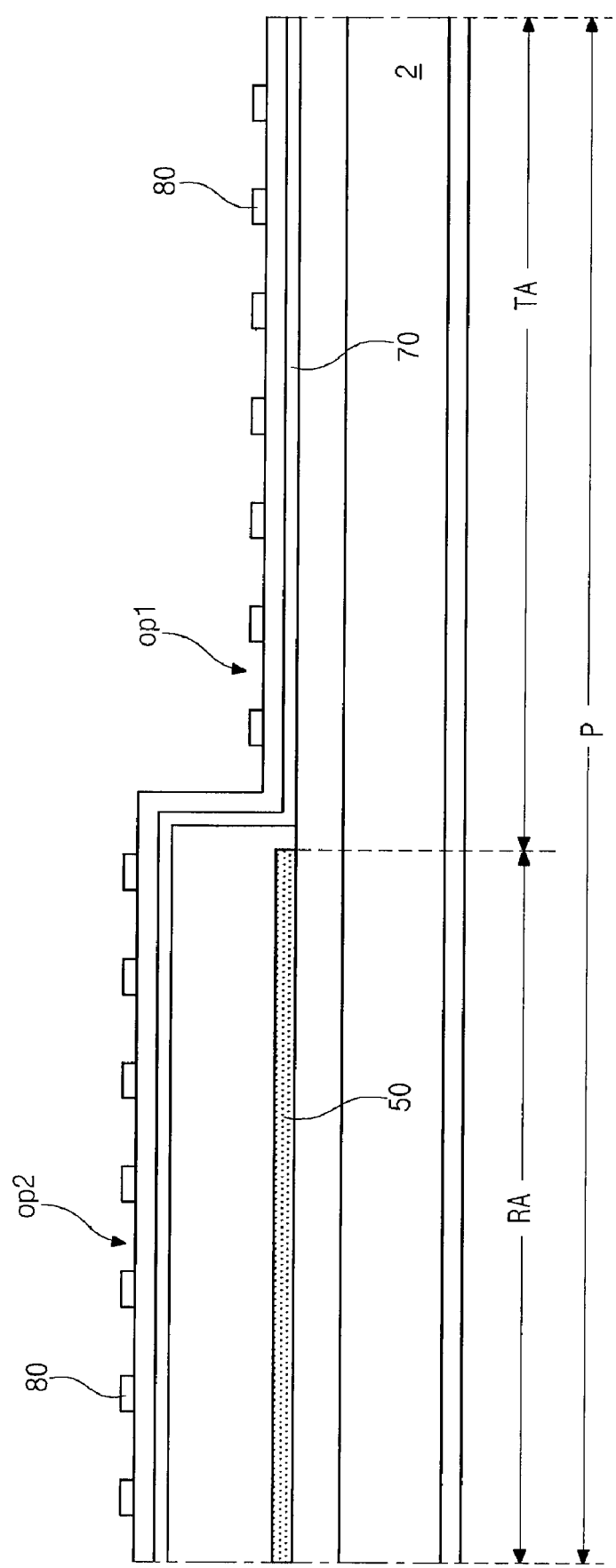
FIG. 1 is a cross-sectional view illustrating a pixel region of an array substrate for an IPS mode transflective LCD type device according to the related art.
Figure 2:
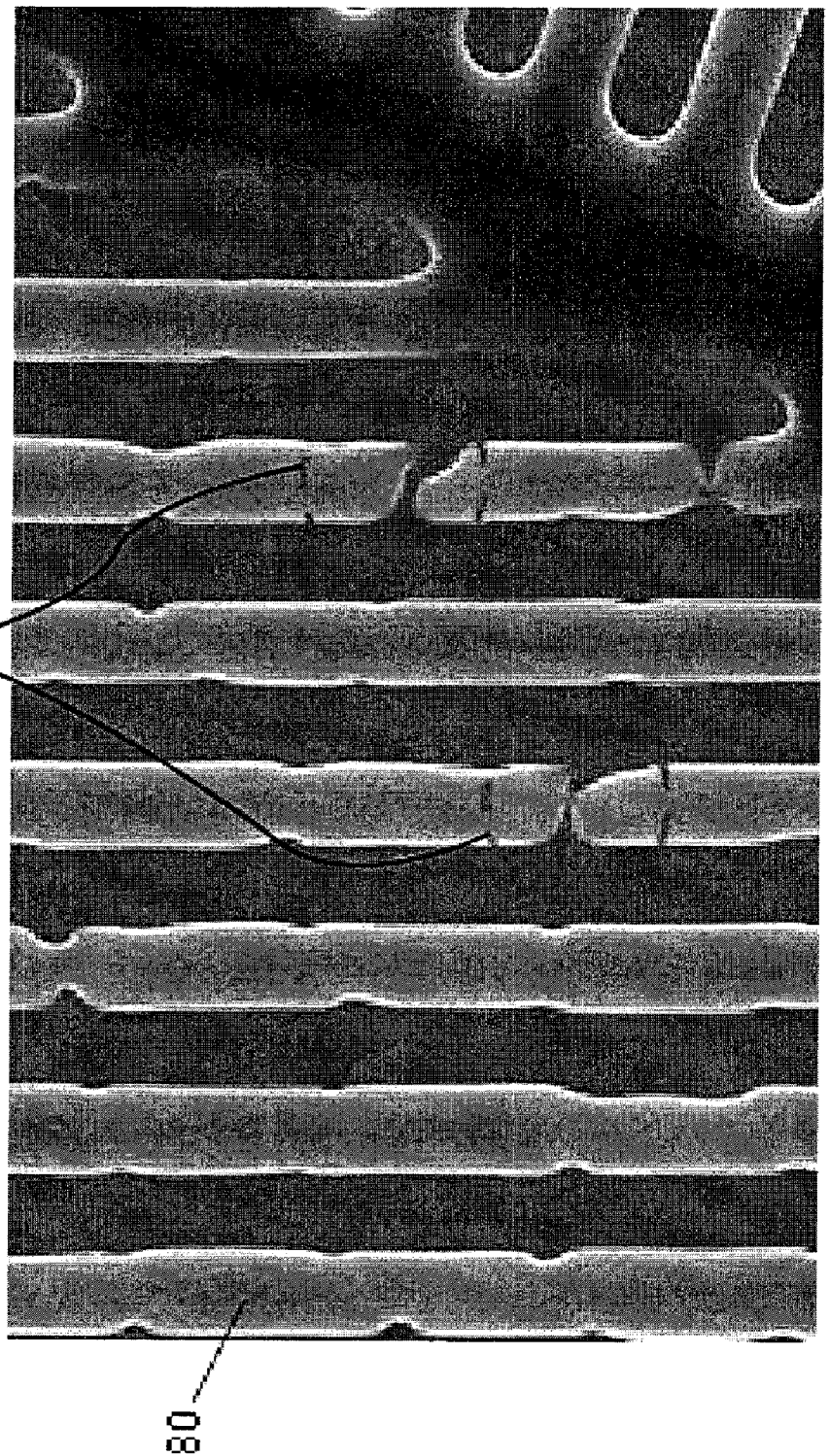
FIG. 2 is a picture illustrating disconnection defect of a common electrode of the LCD device according to the related art.
Figure 3:
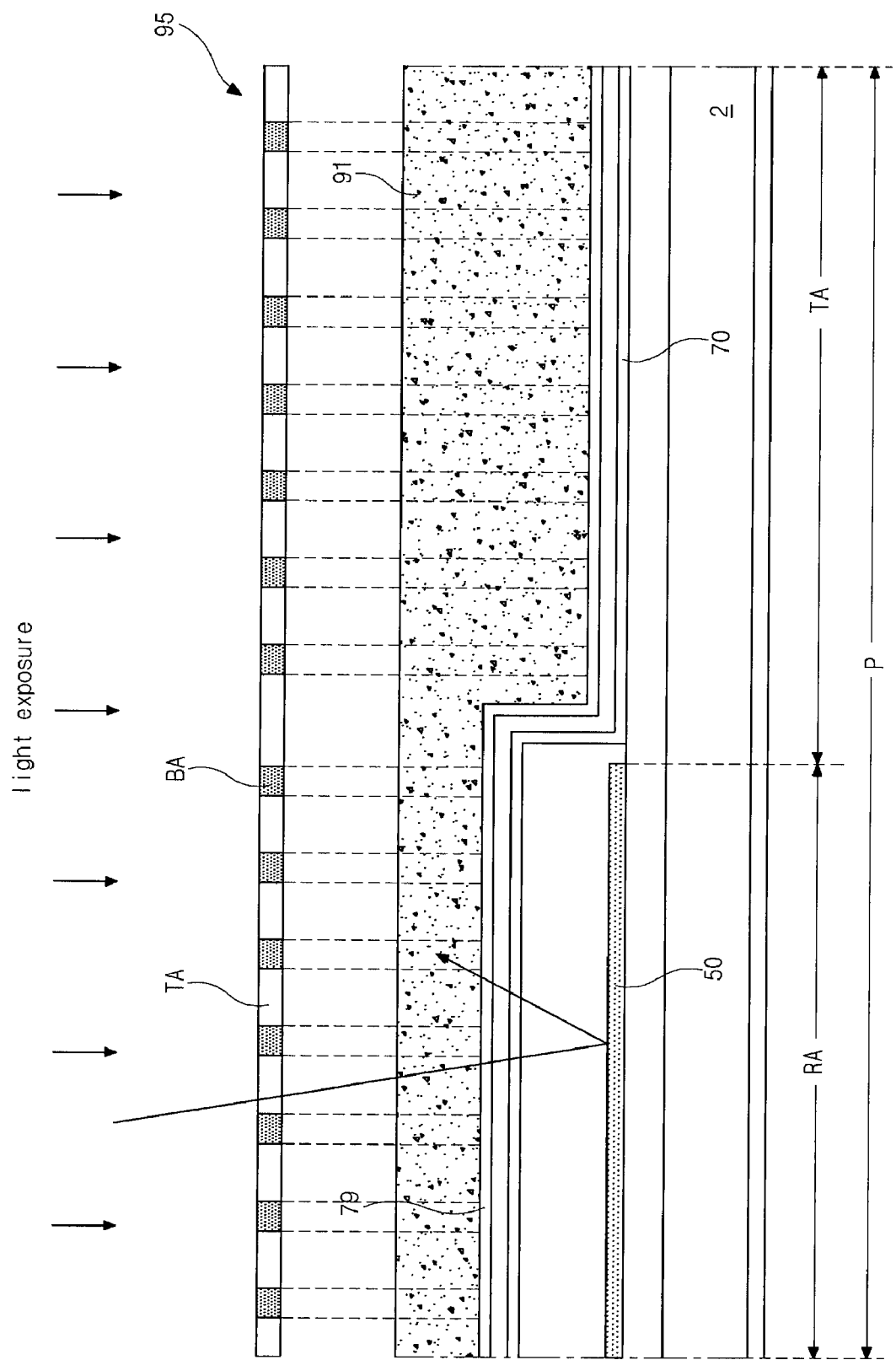
FIG. 3 is a cross-sectional view illustrating a process of forming the common electrode of the LCD device according to the related art.
Figure 4A:
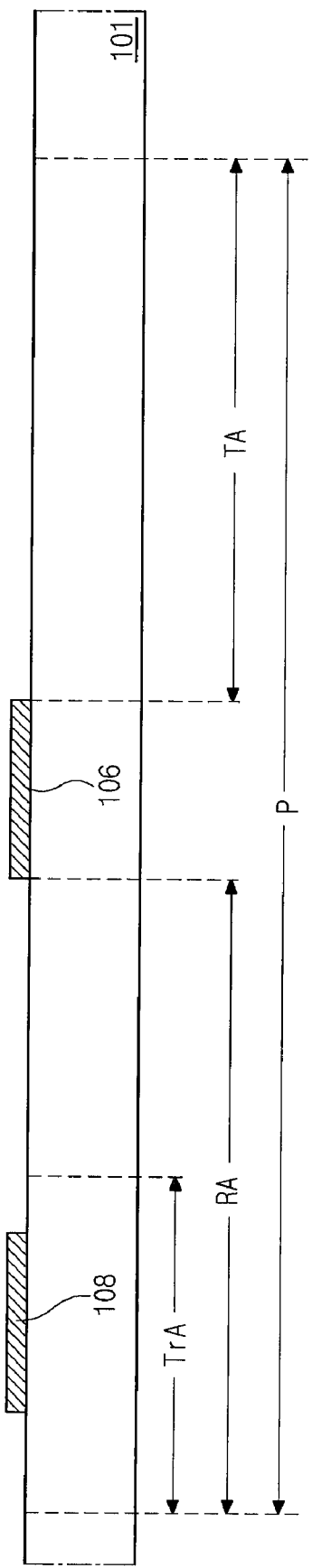
FIGS. 4A to 4P are cross-sectional views illustrating a method of fabricating an array substrate for an LCD device according to an embodiment of the present invention.
Figure 4B:
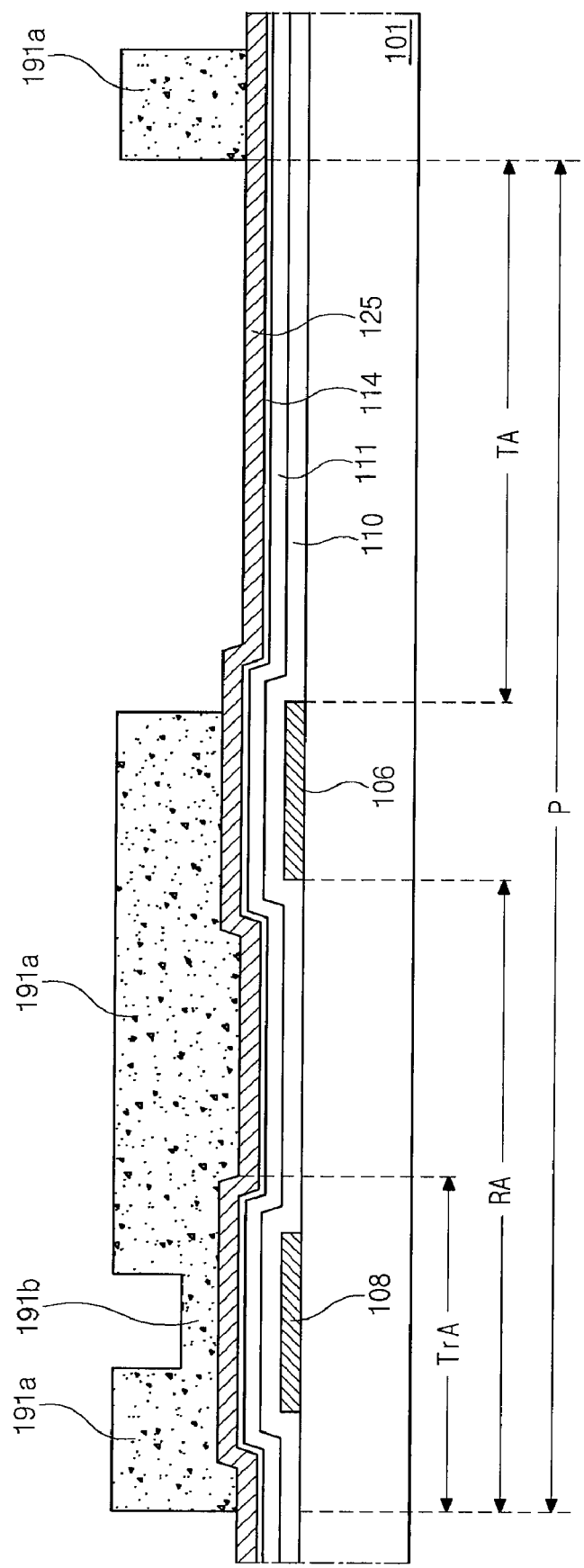
Figure 4C:
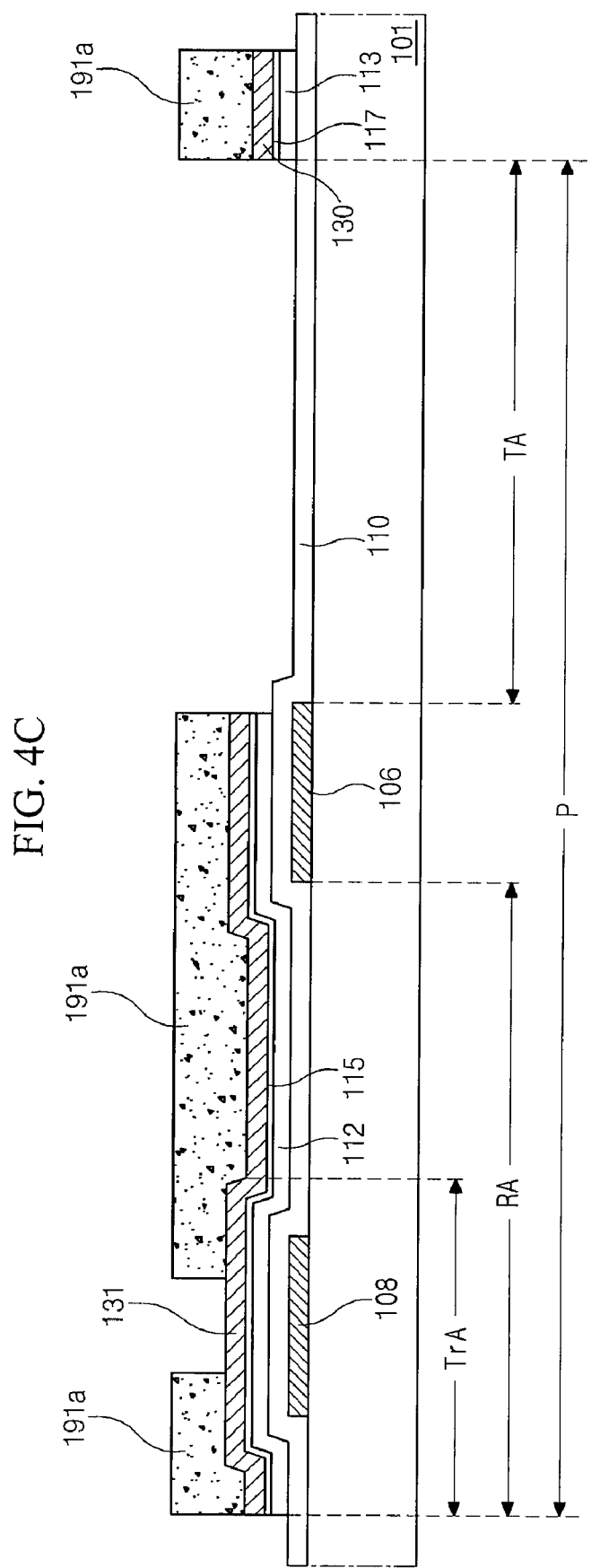
Figure 4F:
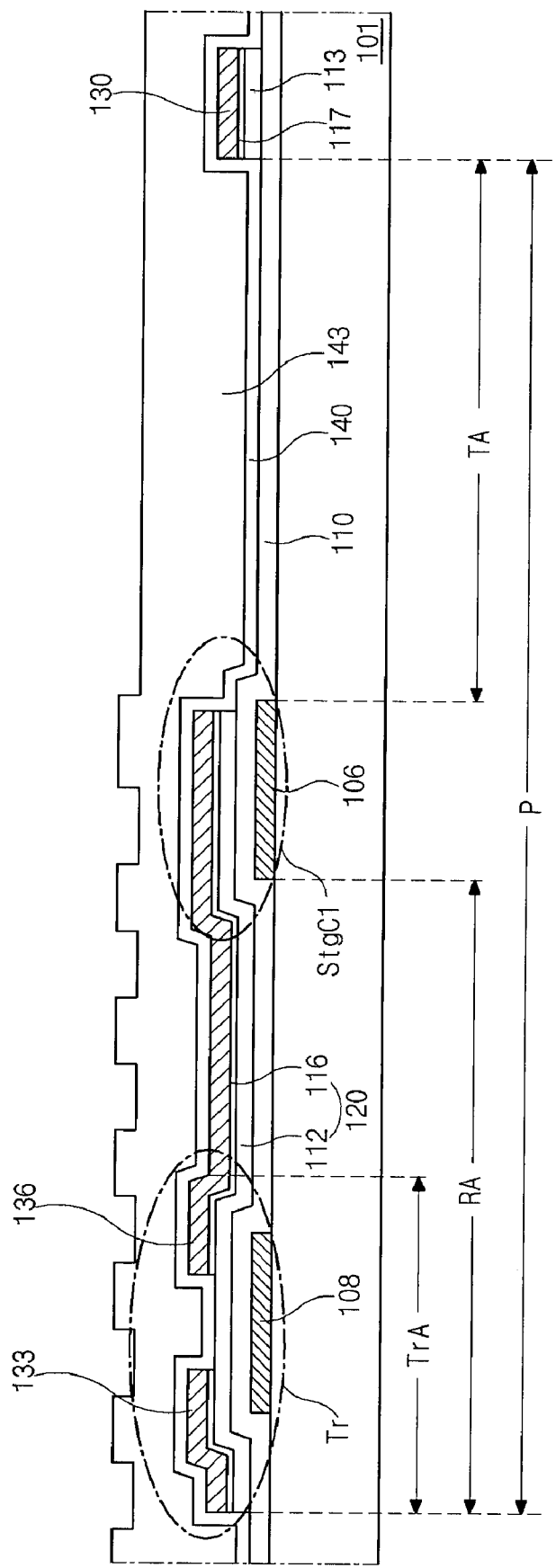
Figure 4G:
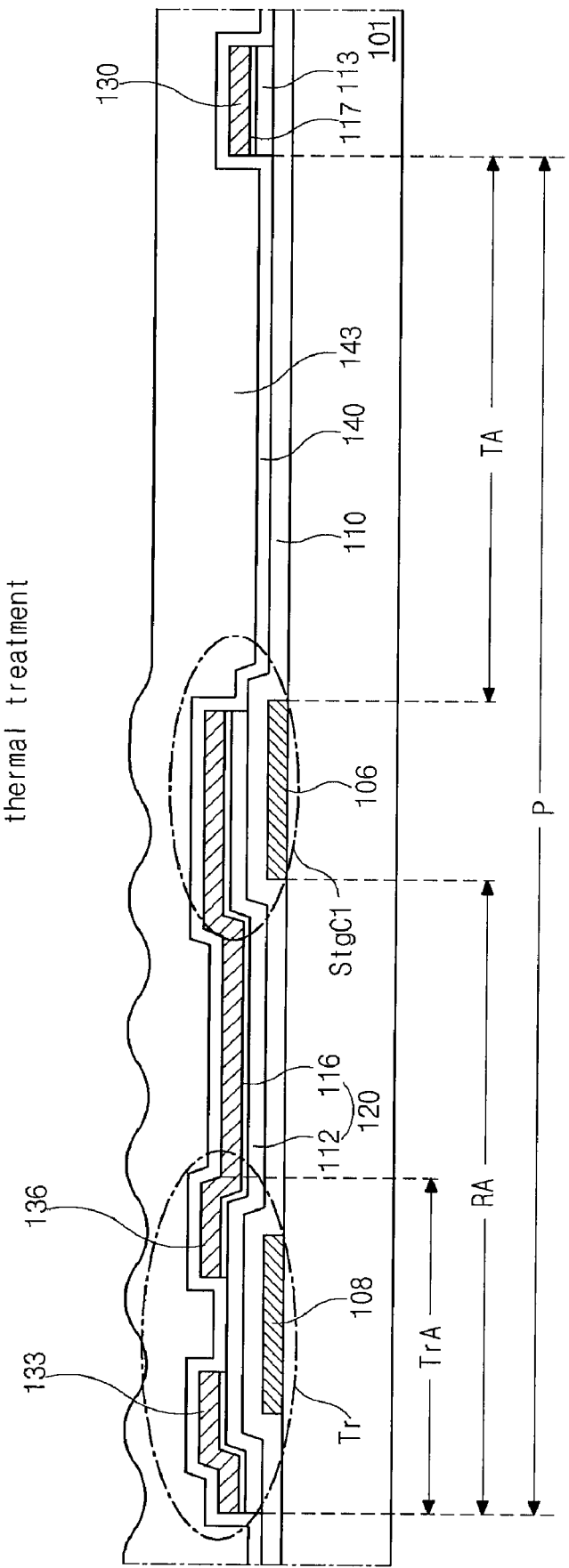
Figure 4H:
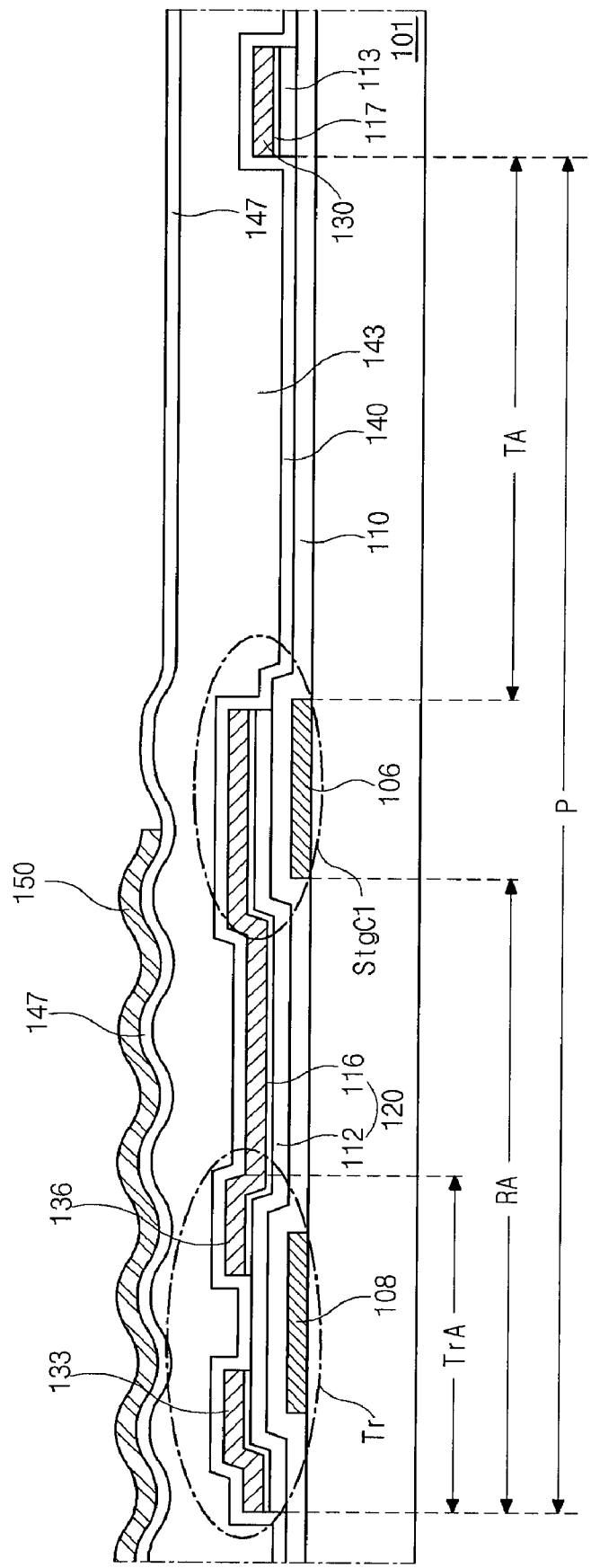
Figure 4I:
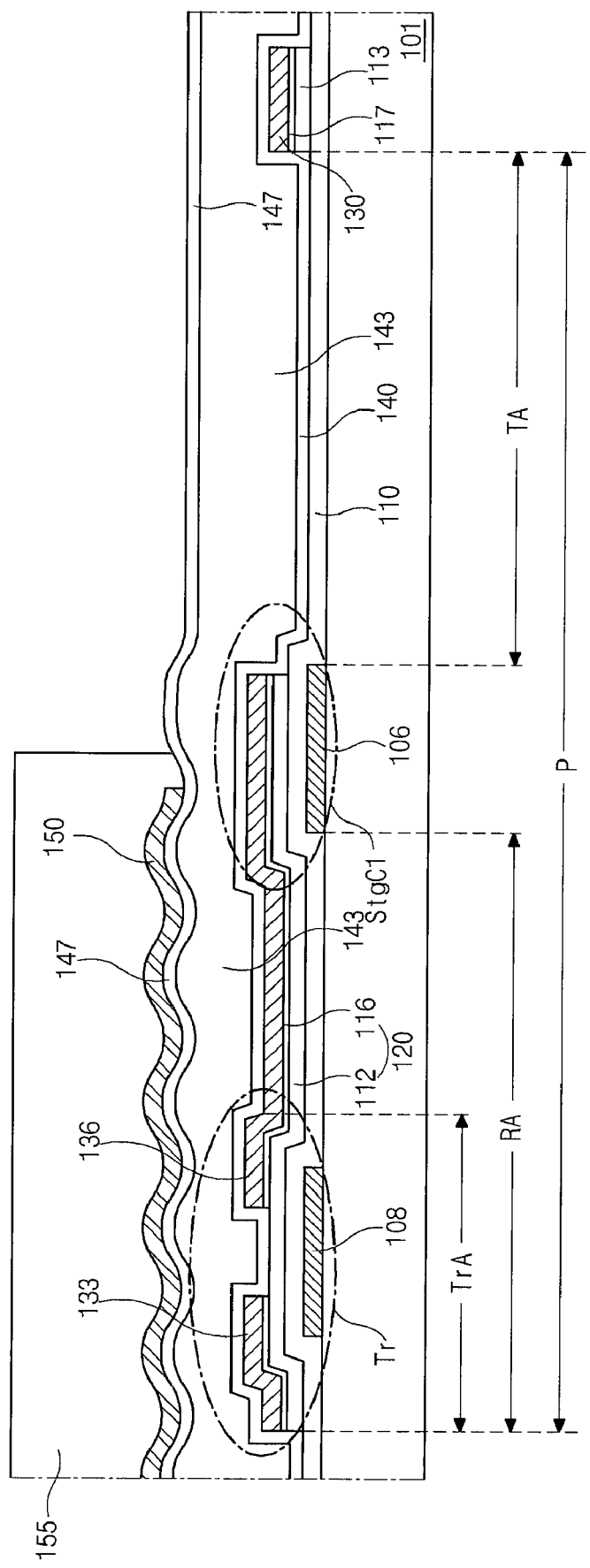
Figure 4K:
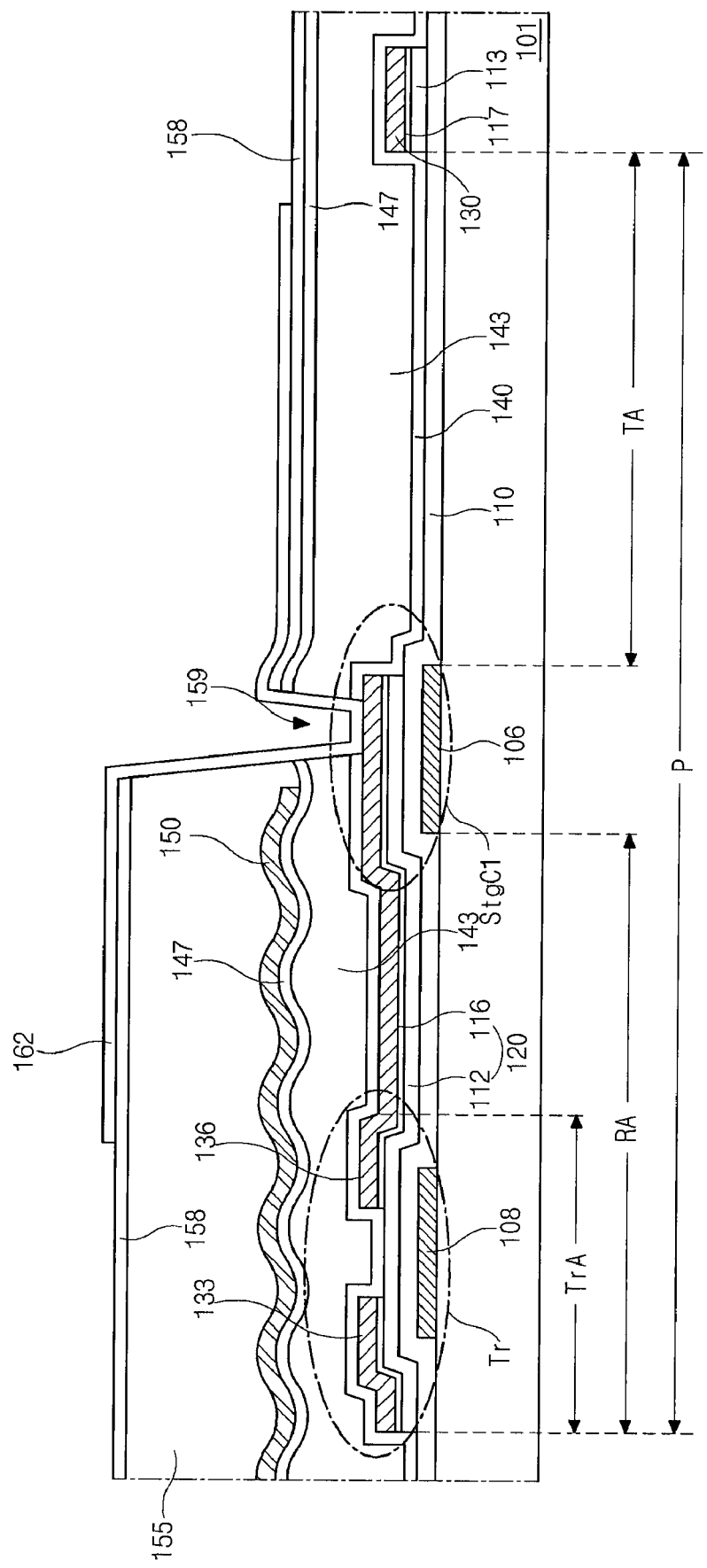
Figure 4L:
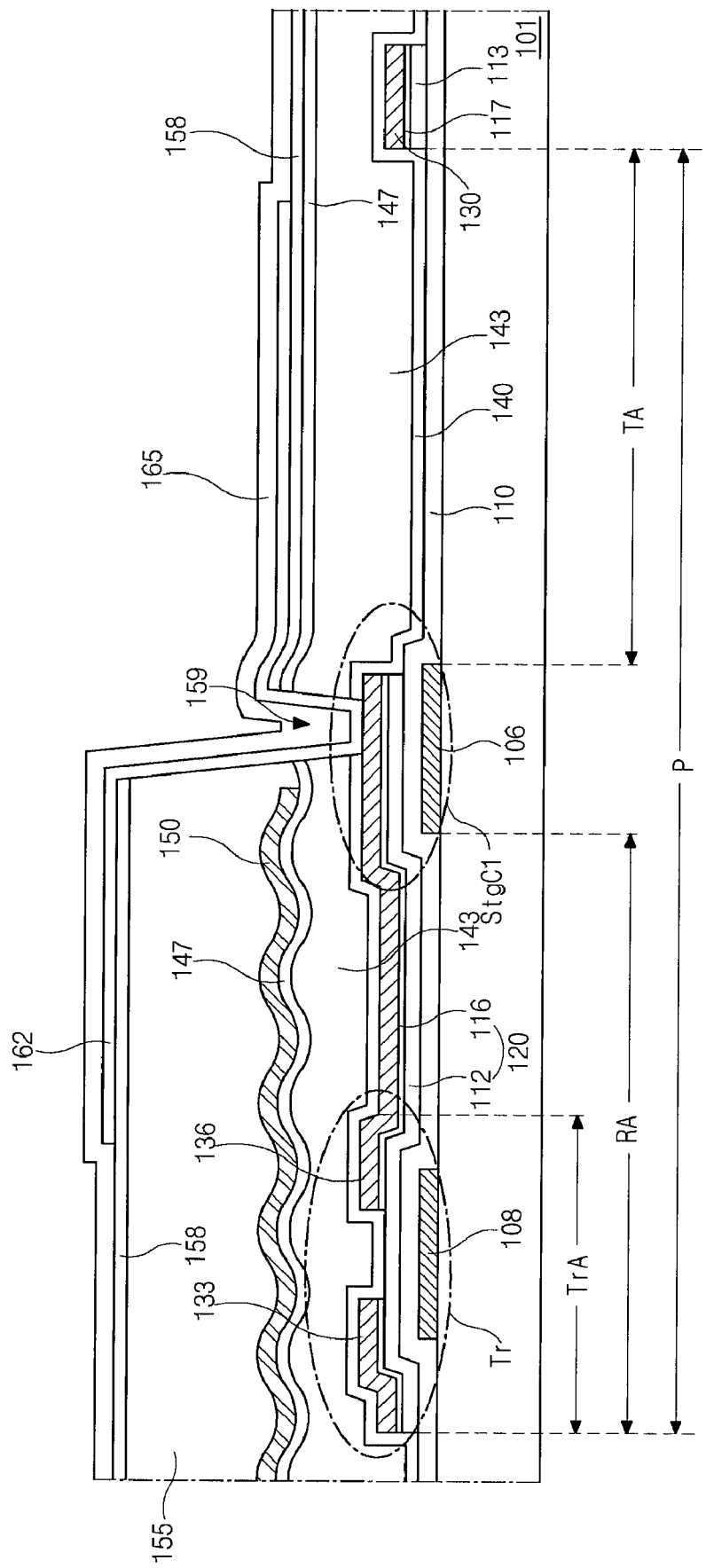
Figure 4M:
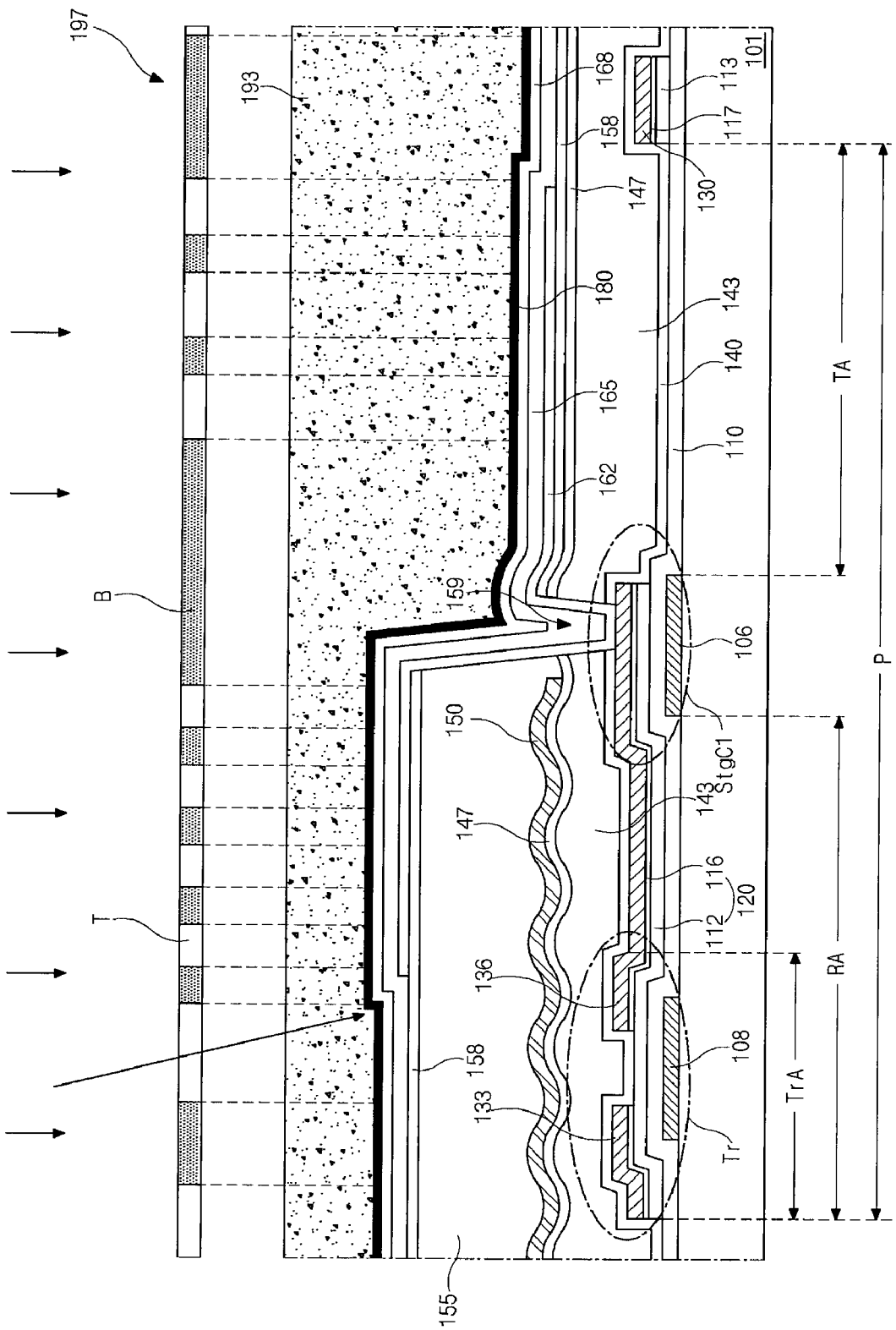
Figure 4N:
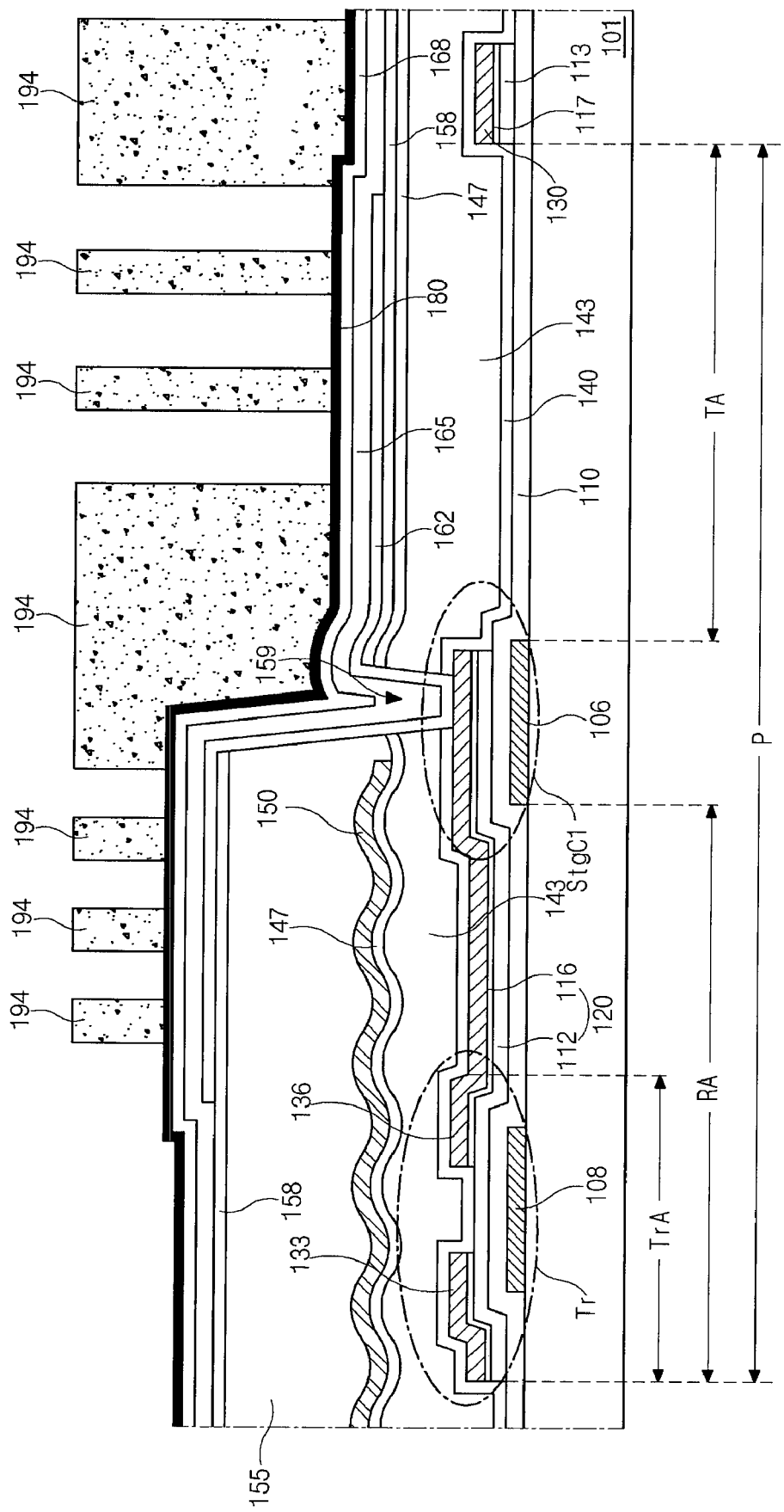
Figure 4P:
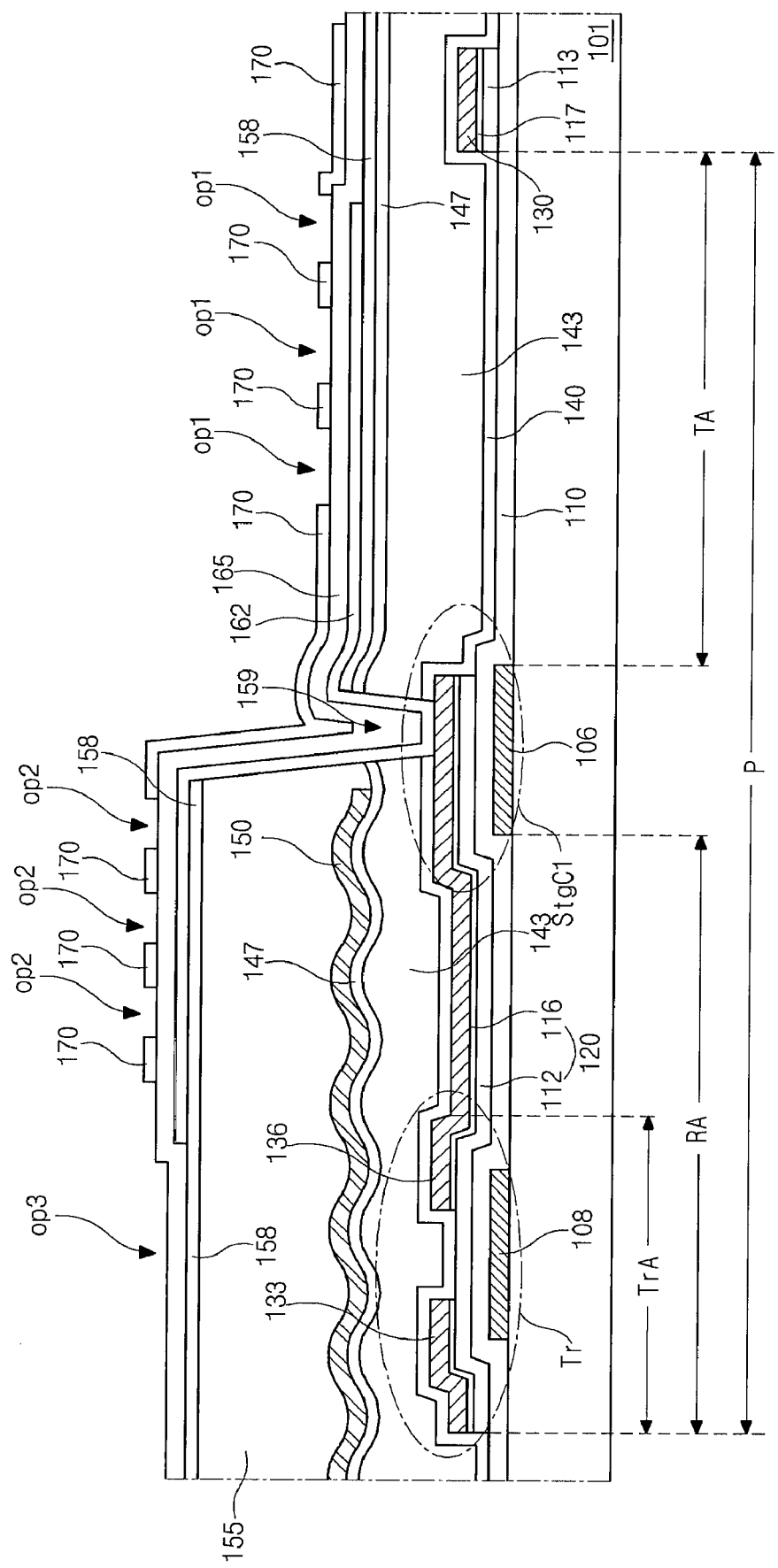

FIGS. 4A to 4P are cross-sectional views illustrating a method of fabricating an array substrate for an LCD device according to an embodiment of the present invention.

In the drawings, a pixel region P, a switching region TrA, a reflective region RA, and a transmissive region TA are defined in the array substrate. The switching region TrA, the reflective region RA, and the transmissive region TA are in the pixel region P.

Referring to FIG. 4A, a first metal layer is formed on a substrate 101. The first metal layer may be formed by depositing at least one of metal materials including, but not limited to, aluminum (Al), aluminum alloy (e.g., AlNd), copper (Cu), copper alloy, molybdenum (Mo), molybdenum alloy and chromium (Cr).

Then, performed is a mask process that includes, for example, forming a photoresist layer on the first metal layer, exposing the photoresist layer to light using a photo mask including a blocking portion and a transmissive portion, developing the photoresist layer, etching the first metal layer using the developed photoresist layer, stripping the photoresist layer and the like. Through the mask process, the first metal layer is patterned to form a gate line (not shown), a common line 106, and a gate electrode 108. The common line 106 is in parallel with and spaced apart from the gate line, and the gate electrode 108 is formed in the switching region TrA and connected to the gate line.

The first metal layer may be formed in a single-layered structure using one of the above-described materials, as shown in the drawings, and alternatively, may be formed in a multiple-layered structure using at least two of the above-described materials.

The common line 106 may include a portion extended into the reflective region RA, and the extended portion may function as a first storage electrode.

Referring to FIG. 4B, a gate insulating layer 110 is formed on the substrate 101 having the gate electrode 108. The gate insulating layer 110 may be made of an inorganic insulating material that includes, but not limited to, silicon oxide ($SiO_2$) and silicon nitride (SiNx). An intrinsic amorphous silicon layer 111 and an extrinsic amorphous silicon layer 114 are sequentially formed on the gate insulating layer 110. The gate insulating layer 110, the intrinsic amorphous silicon layer 111 and the extrinsic amorphous silicon layer 114 may be sequentially formed in the same chamber (not shown) of an apparatus, for example, a chemical vapor deposition (CVD) apparatus by replacing reaction gases.

Then, a second metal layer 145 is formed on the extrinsic amorphous silicon layer 114. The second metal layer may be formed by depositing at least one of metal materials including, but not limited to, copper (Cu), copper alloy, molybdenum (Mo), molybdenum alloy and chromium (Cr).

The second metal layer 145 may be formed in a single-layered structure using one of the above-described materials, as shown in the drawings, and alternatively, may be formed in a multiple-layered structure using at least two of the above-described materials.

Then, a photoresist layer is formed on the second metal layer 145, exposed to light using a photo mask, for example, a halftone or light diffraction mask including a blocking portion, a transmissive portion and a semi-transmissive portion, and developed, thereby forming a first photoresist pattern 191a having a first thickness and a second photoresist pattern 191b having a second thickness less than the first thickness.

Referring to FIG. 4C, the second metal layer 125, the extrinsic amorphous silicon layer 114 and the intrinsic amorphous silicon layer 111 are etched using the first and second photoresist patterns 191a and 191b. Through the etching process, a data line 130 crossing the gate line to define the pixel region P is formed, and a metal pattern 131 connected to the data line 130 and the extrinsic amorphous silicon pattern 115 and an active layer 112 of the intrinsic amorphous silicon are formed. The metal pattern 131, the extrinsic amorphous silicon pattern 115 and the active layer 112 have substantially the same shape in plane.

In addition, through the etching process, first and second dummy patterns 113 and 117 below the data line 130 are formed. The first and second dummy patterns 113 and 117 are made of the intrinsic amorphous silicon and the extrinsic amorphous silicon, respectively.

Then, an ashing process is performed to remove the second photoresist pattern 191b. Through the ashing process, the thickness of the first photoresist pattern 191a is reduced, but the first photoresist pattern 191a still remains on the data line 130 and the metal pattern 131.

Referring to FIG. 4D, a dry etching process is performed for the metal pattern 131 and the extrinsic amorphous silicon pattern 115 using the first photoresist pattern 191a as an etching mask. Through the dry etching process, source and drain electrodes 133 and 136 spaced apart from each other, and an ohmic contact layer 116 below the source and drain electrodes 133 and 136 are formed. The source electrode 133 is connected to the data line 130. Further, the active layer 112 between the source and drain electrodes 133 and 136 are exposed.

The drain electrode 136 may be formed such that a portion of the drain electrode 136 overlap the extended portion of the common line 106 and functions as a second storage electrode. The portions of the drain electrode 136 and the common line 106 overlapping each other forms a first storage capacitor StgC1 with the gate insulating layer 110 therebetween. Alternatively, the first storage capacitor StgC1 may be not formed.

The active layer 112 and the ohmic contact layer 116 form a semiconductor layer 120. The gate electrode 108, the gate insulating layer 110, the semiconductor layer 120, and the source and drain electrodes 133 and 136 form a thin film transistor Tr.

Referring to FIG. 4E, a stripping process is performed to remove the first photoresist pattern 191a on the source and drain electrodes 133 and 136 and the data line 130.

Referring to FIG. 4F, a first passivation layer 140 is formed on the substrate 101 having the source and drain electrodes 133 and 136. The first passivation layer 140 may be made of an inorganic insulating material that includes, but not limited to, silicon oxide ($SiO_2$) and silicon nitride (SiNx).

Then, an organic insulating material, which includes, but not limited to, benzocyclobutene (BCB) and photo acrylic, is formed on the first passivation layer 140, exposed to light using a photo mask that includes a semi-transmissive portion to adjust light exposure intensity, and developed. Through these processes, the second passivation layer 143 is formed, and a surface of the second passivation layer 140 corresponding to the reflective region RA may have substantially an angular uneven shape. The angular uneven shape may mean that rectangular rising and falling portions alternates.

A surface of the second passivation layer 140 corresponding to the transmissive portion TA may have an even shape.

The first passivation layer 140 can function to prevent property degradation of the thin film transistor Tr that may occur when the second passivation layer 143 directly contacts the active layer 112. However, it should be understood that the first passivation layer 140 may be omitted.

Referring to FIG. 4G, a thermal treatment is performed such that the surface of the second passivation layer 143 in the reflective region RA has substantially a curved uneven shape. The curved uneven shape may mean that smoothly curved rising and falling portions alternates. The surface of the second passivation layer 143 in the transmissive region TA may still be even irrespective of the thermal treatment.

Referring to FIG. 4H, a third passivation layer 147 is formed on the second passivation layer 143. The third passivation layer 147 of the reflective region RA has the curved uneven shape due to the curved uneven shape of the second passivation layer 143 therebelow. The third passivation layer 147 may be made of an inorganic insulating material that includes, but not limited to, silicon oxide ($SiO_2$) and silicon nitride (SiNx).

Then, a third metal layer is formed and patterned in a mask process to form a reflective plate 150 in the reflective region RA. The reflective plate 150 may be made of a metal material having a high reflection property that includes, but not limited to, aluminum (Al) and aluminum alloy (e.g., AlNd). The reflective plate 150 also has the curved uneven shape.

The third passivation layer 147 can function to improve adhesion property of the reflective plate 150. In other words, since the reflective plate 150 adheres onto the inorganic insulating material better than the organic insulating material, the third passivation layer 147 is formed between the second passivation layer 143 and the reflective plate 150. However, it should be understood that the third passivation layer 140 may be omitted.

Referring to FIG. 4I, an organic insulating material, which includes, but not limited to, benzocyclobutene (BCB) and photo acrylic, is formed on the substrate 101 having the reflective plate 150, and patterned in a mask process to form a fourth passivation layer 155 in the reflective region RA. The fourth passivation layer 155 has substantially an even surface. By forming the fourth passivation layer 155 in the reflective region RA, a step is formed between the reflective and transmissive regions RA and TA. According to this configuration, thicknesses between liquid crystal layers of the reflective and transmissive regions RA and TA are different. Further, since the fourth passivation layer 155 covers the uneven shape therebelow such that the uneven shape is not applied to components to be formed over the fourth passivation layer 155, the uneven shape does not have an effect on the components to be formed over the fourth passivation layer 155.

In a reflective mode, an external light passes through a liquid crystal layer in the reflective region RA, then is reflected by the reflective plate 150, then passes through the liquid crystal layer again, and then reaches a user. As such, in the reflective mode, the light passes through the liquid crystal layer twice. However, in a transmissive mode, a light emitted from a backlight unit passes through a liquid crystal layer in the transmissive region TA, and then reaches a user. As such, in the transmissive mode, the light passes through the liquid crystal layer once. Accordingly, phase difference of light between the reflective mode and the transmissive mode occurs. To compensate for the phase difference, the thickness of the liquid crystal layer in the transmissive region TA is required to be about twice the thickness of the liquid crystal layer in the reflective region RA. To do this, the fourth passivation layer 155 may be formed in the reflective region RA such that the above thickness relation between the liquid crystal layers of the reflective and transmissive regions RA and TA is obtained.

Referring to FIG. 4J, a fifth passivation layer 158 is formed on the substrate 101 having the fourth passivation layer 155. The fifth passivation layer 158 may be made of an inorganic insulating material that includes, but not limited to, silicon oxide ($SiO_2$) and silicon oxide (SiNx).

Then, a mask process is performed to form a drain contact hole 159 exposing the drain electrode 136. To do this, the layers, for example, the first to fifth passivation layers over the drain electrode 136 are patterned in the mask process.

Referring to FIG. 4K, a first transparent conductive material layer, which includes, but not limited to, indium-tin-oxide (ITO), indium-zinc-oxide (IZO) and indium-tin-zinc-oxide (ITZO), is formed on the fifth passivation layer 158 and patterned to form a pixel electrode 162 in the pixel region P. The pixel electrode 162 is formed over both of the reflective and transmissive regions RA and TA.

The fifth passivation layer 158 can function to improve adhesion property of the pixel electrode 162. However, it should be understood that the fifth passivation layer 158 may be omitted.

In the process of forming the pixel electrode 162, a common contact hole (not shown) that exposes the common line 106 may be formed at a region where the pixel electrode 162 is formed and the common line 106 overlap the pixel electrode 162. The common line 106 may contact a common electrode (170 of FIG. 4P) to be formed later through the common contact hole. In this case, an auxiliary hole (not shown) may be formed in the pixel electrode 162, correspond to the common contact hole, and have an area greater than the common contact hole. In other words, in plane view, the common contact hole is located inside the auxiliary hole. This configuration may be for preventing short-circuit that may occur between the pixel electrode (162) and the common electrode 170 through the common contact hole. However, when the common contact hole is formed in a region that is outside the pixel electrode 162 and over the common line 106, the auxiliary hole may not be formed in the pixel electrode 162.

Referring to FIG. 4L, a sixth passivation layer 165 is formed on the pixel electrode 162. The sixth passivation layer 165 may be made of an inorganic insulating material that includes, but not limited to, silicon oxide ($SiO_2$) and silicon nitride (SiNx).

Then, a mask process is performed for patterning the sixth passivation layer 165 to form the common contact hole (not shown) in the sixth passivation layer 165 that exposes the common line 106. Further, a gate pad contact hole (not shown) exposing an end portion of the gate line and a data pad contact hole (not shown) exposing an end portion of the data line 130 are formed. When the common contact hole is formed though the pixel electrode 162, as described above, the common contact hole in the sixth passivation layer 165 is inside the auxiliary contact hole.

Referring to FIG. 4M, a second transparent conductive material layer 168 is formed on the sixth passivation layer 165. The second transparent conductive material may include, but not limited to, indium-tin-oxide (ITO), indium-zinc-oxide (IZO) and indium-tin-zinc-oxide (ITZO).

Then, a reflection prevention layer 180 is formed on the second transparent conductive material layer 168. The reflection prevention layer 180 functions to prevent light passing therethrough. The reflection prevention layer 180 may be made of a material that has good light absorptance and is etched using an etching solution not reacting with the transparent conductive material or dry-etched using a reaction gas not reacting with the transparent conductive material. For example, the material includes, but not limited to, molybdenum (Mo) and black resin.

Then, a second photoresist layer 193 is formed on the reflection prevention layer 180.

Then, a photo mask 197 is disposed over the second photoresist layer 193, and a light exposure process is performed. The photo mask 197 may include a blocking portion B and a transmissive portion T. The blocking portion B is located corresponding to a region where the common electrode 170 including a plurality of finger portions is formed, and the transmissive portion T is located corresponding to a region where openings (op1 and op2 of FIG. 4P) between the finger portions of the common electrode 170 are formed.

In the drawings, it is shown that the positive type photoresist layer 193, a portion of which exposed to light is removed when a developing process is performed, is used. However, it should be understood that a negative type photoresist layer, a portion of which not exposed to light is removed when a developing process is performed, may be used, and in this case, positions of the transmissive portion T and the blocking portion B are changed.

Since the reflection prevention layer 180 is formed below the second photoresist layer 193 and over the reflective plate 150, when the light exposure process is performed, light emitted from a light exposure device and then passing through the transmissive portion T is incident on the second photoresist layer 193 and reacts with the second photoresist layer 193, and the light passing through the second photoresist layer 193 reaches the reflection prevention layer 180 and is mostly absorbed by the reflection prevention layer 180. Accordingly, the light is prevented from reaching the reflective plate 150 and being reflected back to the second photoresist layer 193 by the reflective plate 150.

Accordingly, the light exposure pattern, which is substantially the same as the pattern of the photo mask 197, is made on the second photoresist layer 193. In other words, by using the reflection prevention layer 180, the unintentional light incidence on a portion below the blocking portion in the related art is prevented. Therefore, disconnection of the finger portion of the common electrode 170 due to the unintentional light exposure can be prevented.

Referring to FIG. 4N, a developing process is performed for the second photoresist layer 193 to form a photoresist pattern 194.

Referring to FIG. 4O, the reflection prevention layer 180 may be firstly etched to remove portions of the reflection layer 180 exposed through the photoresist pattern 194. Through the first etching, the second transparent conductive material layer 168 is exposed. The first etching is performed using a first etching solution that may not influence the second transparent conductive material layer 168.

Then, a second etching is performed for the second transparent conductive material layer 168 using a second etching solution. Through the second etching, the common electrode 170 is formed. The common electrode 170 includes the plurality of openings op1 and op2 and the plurality of finger portions between the openings opt and op2. The first openings op1 are formed in the transmissive region TA, and the second openings op2 are formed in the reflective region RA. Further, a third opening op3 corresponding to the thin film transistor Tr may be formed.

The reflection prevention layer 180 may be etched through a dry etching instead of the above-described wet etching. When the dry etching is used, a reaction gas for the dry etching does not react with the second transparent conductive material.

Portions of the pixel electrode 162 and the common electrode 170 overlapping each other may form a second storage capacitor with the sixth passivation layer 165 therebetween.

Referring to FIG. 4P, a stripping process is performed to remove the photoresist pattern 194, and then the reflection prevention layer 180 remaining on the common electrode 170 is removed, for example, using the first etching solution.

Through the above-described processes, the array substrate for the LCD device according to the embodiment can be fabricated. By coupling the array substrate to an opposing substrate with a liquid crystal layer therebetween, the LCD device can be fabricated.

Figure 5:
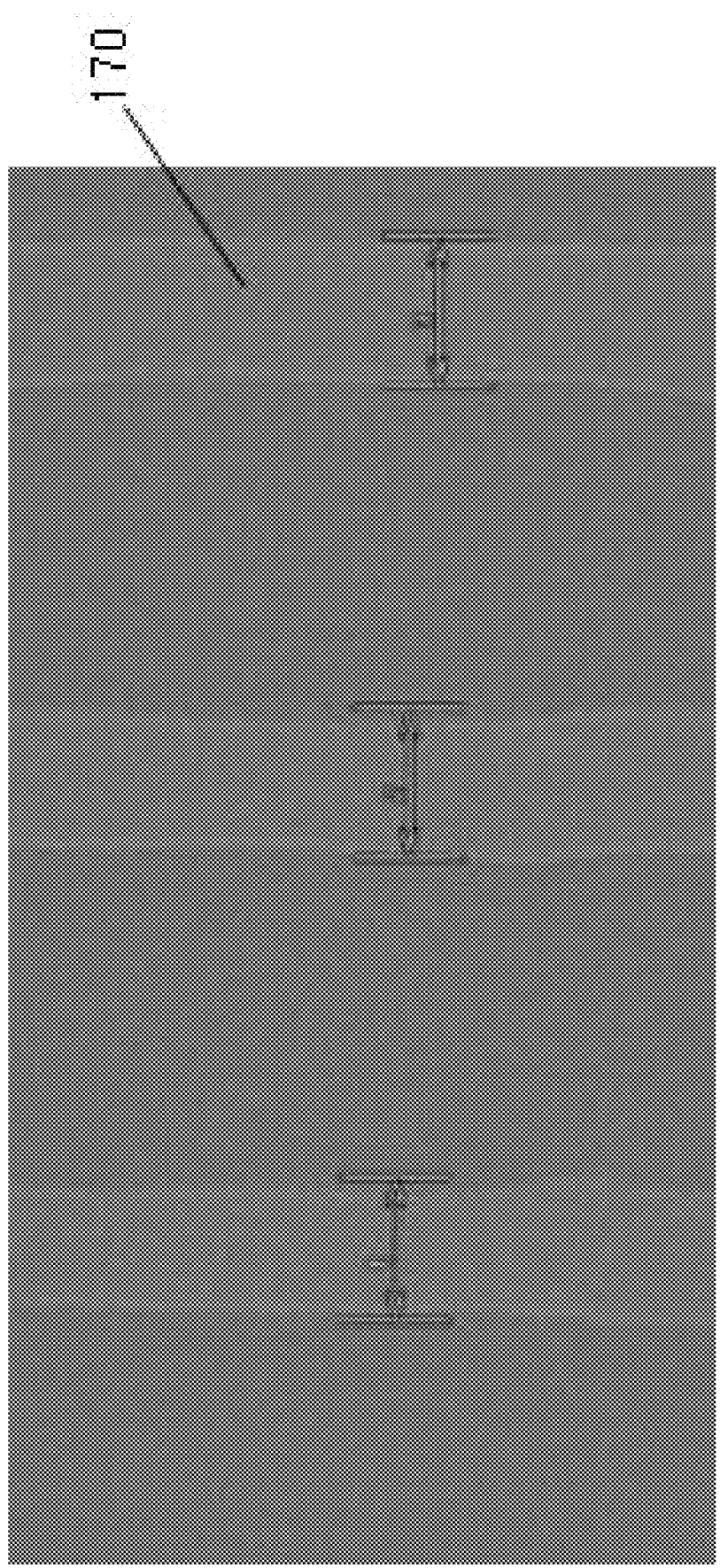
FIG. 5 is a picture illustrating the common electrode formed through the method according to the embodiment of the present invention.

FIG. 5 is a picture illustrating the common electrode formed through the method according to the embodiment of the present invention.

Referring to FIG. 5, it is shown that finger portions of the common electrode 170 have no disconnection therein. Further, the finger portions extend in desired uniform width without dents at side.

However, in the related art, the finger portions have disconnection. Further, the finger portions have some dents at side and extend roughly in non-uniform width. This causes deformation of a fringe electric field induced between the pixel electrode and the common electrode. In addition, the electric field is concentrated near the dents, and overload due to the concentrated electric field may cause another disconnection.

However, since the finger portions of the common electrode 170 of the embodiment are formed smoothly in uniform width, a fringe electric field can be stably induced, and the disconnection due to the concentrated electrode field in the related art can be prevented.

As described above, according to the embodiments of the present invention, the disconnection of the common electrode can be effectively prevented, and the stable electric field can be formed. Therefore, production efficiency can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a transflective type liquid crystal display device, the method comprising:
    forming gate and data lines with a gate insulating layer therebetween on a substrate and crossing each other to define a pixel region that includes a switching region, a reflective region, and a transmissive region;
    forming a thin film transistor corresponding to the switching region and connected to the gate and data lines;
    forming a first passivation layer on the thin film transistor;
    forming a reflective plate on the first passivation layer in the reflective region;
    forming a second passivation layer on the reflective plate;
    forming a pixel electrode on the second passivation layer and connected to a drain electrode of the thin film transistor;
    forming a third passivation layer on the pixel electrode;
    forming a transparent conductive material layer on the third passivation layer;
    forming a reflection prevention layer on the transparent conductive material layer; and
    patterning the reflection prevention layer and the transparent conductive material layer to form a common electrode that includes a plurality of openings and is made of the transparent conductive material.

2. The method according to claim 1, wherein forming and patterning the transparent conductive material layer and the reflection prevention layer include:
    forming a photoresist layer on the reflection prevention layer;
    exposing the photoresist layer to light using a photo mask;
    developing the light-exposed photoresist layer to form a photoresist pattern exposing the reflection prevention layer corresponding to the openings;
    removing the exposed reflection prevention layer to expose the transparent conductive material layer therebelow;
    removing the exposed transparent conductive material layer to form the common electrode including the openings;
    performing a stripping to remove the photoresist pattern; and
    removing the reflection prevention layer on the common electrode.

3. The method according to claim 2, wherein the reflection prevention layer is removed through a wet etching using a first etching solution that does not react with the transparent conductive material layer, or a dry etching using a reaction gas that does not react with the transparent conductive material layer.

4. The method according to claim 1, wherein the reflection prevention layer is made of a material that has property of non-reflecting and absorbing light and preventing light from passing therethrough.

5. The method according to claim 4, wherein the reflection prevention layer is made of molybdenum (Mo) or black resin.

6. The method according to claim 1, wherein a surface of the first passivation layer in the reflective region has a curved uneven shape, and a surface of the first passivation layer in the transmissive region has an even shape.

7. The method according to claim 6, wherein a surface of the reflective plate has the curved uneven shape due to the curved uneven shape of the first passivation layer in the reflective region.

8. The method according to claim 1, wherein each of the first and second passivation layers is made of an organic insulating material, and the third passivation layer is made of an inorganic insulating material.

9. The method according to claim 8, further comprising:
    forming a fourth passivation layer between the thin film transistor and the first passivation layer and made of an inorganic insulating material;
    forming a fifth passivation layer between the first passivation layer and the reflective plate and made of an inorganic insulating material; and
    forming a sixth passivation layer between the second passivation layer and the pixel electrode and made of an inorganic insulating material.

10. The method according to claim 1, wherein forming the gate line includes forming a common line passing through the pixel region, and in parallel with and spaced apart from the gate line, and forming the thin film transistor includes forming an end portion of the drain electrode overlapping the common line with the gate insulating layer therebetween to form a storage capacitor.

11. The method according to claim 10, wherein the third passivation layer includes a common contact hole exposing the common line, and the common electrode contacts the common line through the common contact hole.

12. The method according to claim 1, wherein the openings includes first and second openings, the first opening is formed in the transmissive region and extends in a first direction, and the second opening is formed in the reflective region and extends in a second direction.

13. The method according to claim 12, wherein the openings further include a third opening corresponding to the thin film transistor.

* * * * *